(12) United States Patent
Chang et al.

(10) Patent No.: US 12,695,327 B2
(45) Date of Patent: Jul. 28, 2026

(54) WIRELESS CHARGING CRADLE FOR TERMINAL AND DISPLAY DEVICE COMPRISING SAME

(71) Applicant: LG ELECTRONICS INC., Seoul (KR)

(72) Inventors: Chunsoo Chang, Seoul (KR); Kukyoul Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 862 days.

(21) Appl. No.: 18/016,635

(22) PCT Filed: Jul. 15, 2020

(86) PCT No.: PCT/KR2020/009345
§ 371 (c)(1),
(2) Date: Jan. 17, 2023

(87) PCT Pub. No.: WO2022/014742
PCT Pub. Date: Jan. 20, 2022

(65) Prior Publication Data
US 2023/0291233 A1      Sep. 14, 2023

(51) Int. Cl.
*H02J 50/00*          (2016.01)
*H02J 7/70*           (2026.01)
(Continued)

(52) U.S. Cl.
CPC .............. *H02J 50/005* (2020.01); *H02J 7/70* (2026.01); *H02J 50/10* (2016.02); *H05K 5/0018* (2022.08)

(58) Field of Classification Search
CPC .... F16M 11/041; F16M 11/10; F16M 11/105; F16M 11/2014; F16M 13/02;
(Continued)

(56) References Cited

U.S. PATENT DOCUMENTS

| | | | | |
|---|---|---|---|---|
| 9,093,856 B2 * | 7/2015 | Han | .................... | H02J 7/0042 |
| 2013/0113421 A1 * | 5/2013 | Han | .................... | H02J 7/0042 |
| | | | | 320/108 |

(Continued)

FOREIGN PATENT DOCUMENTS

| | | |
|---|---|---|
| CN | 203660606 | 6/2014 |
| CN | 105587973 | 1/2018 |

(Continued)

OTHER PUBLICATIONS

European Patent Office Application Serial No. 24219278.9, Search Report dated Apr. 25, 2025, 7 pages.

(Continued)

*Primary Examiner* — Timothy J Thompson
*Assistant Examiner* — Rhadames Alonzo Miller
(74) *Attorney, Agent, or Firm* — LEE, HONG, DEGERMAN, KANG & WAIMEY

(57) ABSTRACT

A terminal wireless charging cradle may comprise a body disposed horizontally, a recess formed to be stepped downward from an upper surface of the body, a supporter having a wireless charging circuit built therein and movable between a first position laid down in the recess and a second position erected to protrude upward from the recess, a pair of guide grooves formed in both inner surfaces of the recess, and a plurality of protrusions protruding from both lower sides of the supporter into the pair of guide grooves and sliding along the pair of guide grooves when the supporter moves.

15 Claims, 15 Drawing Sheets

(51) Int. Cl.
  *H02J 50/10* (2016.01)
  *H05K 5/00* (2025.01)
(58) Field of Classification Search
  CPC ........ H05K 5/0018; H02J 50/10; H02J 50/12;
  H02J 50/005
  See application file for complete search history.

(56) References Cited

U.S. PATENT DOCUMENTS

| | | | | |
|---|---|---|---|---|
| 2015/0293563 | A1* | 10/2015 | Wharrad | G06F 1/1632 726/20 |
| 2016/0093143 | A1* | 3/2016 | Lamb | G07F 17/3239 463/20 |
| 2016/0120303 | A1* | 5/2016 | Constantino | F16M 11/2014 248/124.2 |
| 2017/0222680 | A1* | 8/2017 | Yan | H04B 1/3883 |

FOREIGN PATENT DOCUMENTS

| | | | |
|---|---|---|---|
| KR | 20120108395 | 10/2012 | |
| KR | 20130048982 | 5/2013 | |
| WO | 9917642 | 4/1999 | |
| WO | WO-9917642 A2 * | 4/1999 | A47B 57/565 |
| WO | 2007083150 | 7/2007 | |

OTHER PUBLICATIONS

European Patent Office Application Serial No. 20945141.8, Search Report dated Apr. 10, 2024, 6 pages.
PCT International Application No. PCT/KR2020/009345, International Search Report dated Apr. 14, 2021, 5 pages.

* cited by examiner

【FIG. 1】
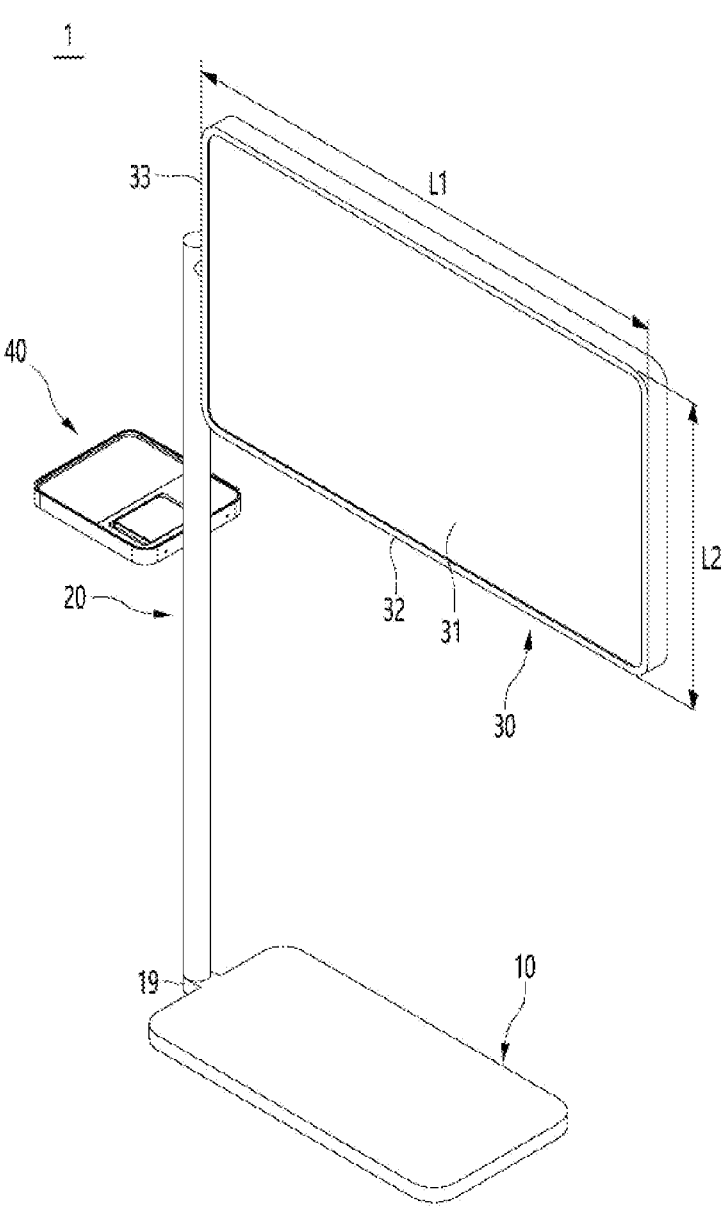

【FIG. 2】
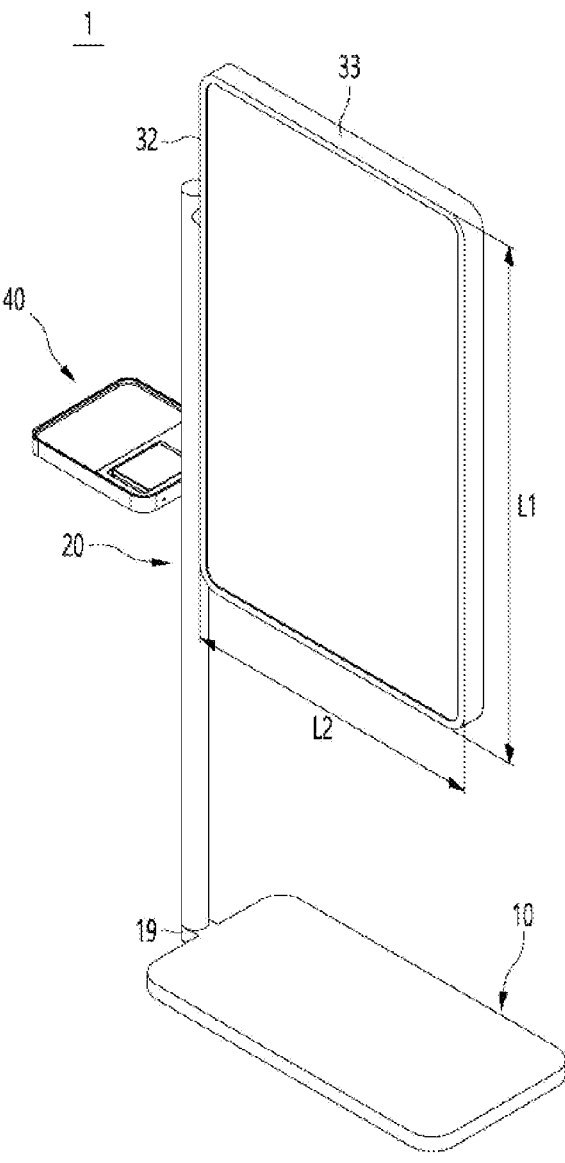

【FIG. 3】
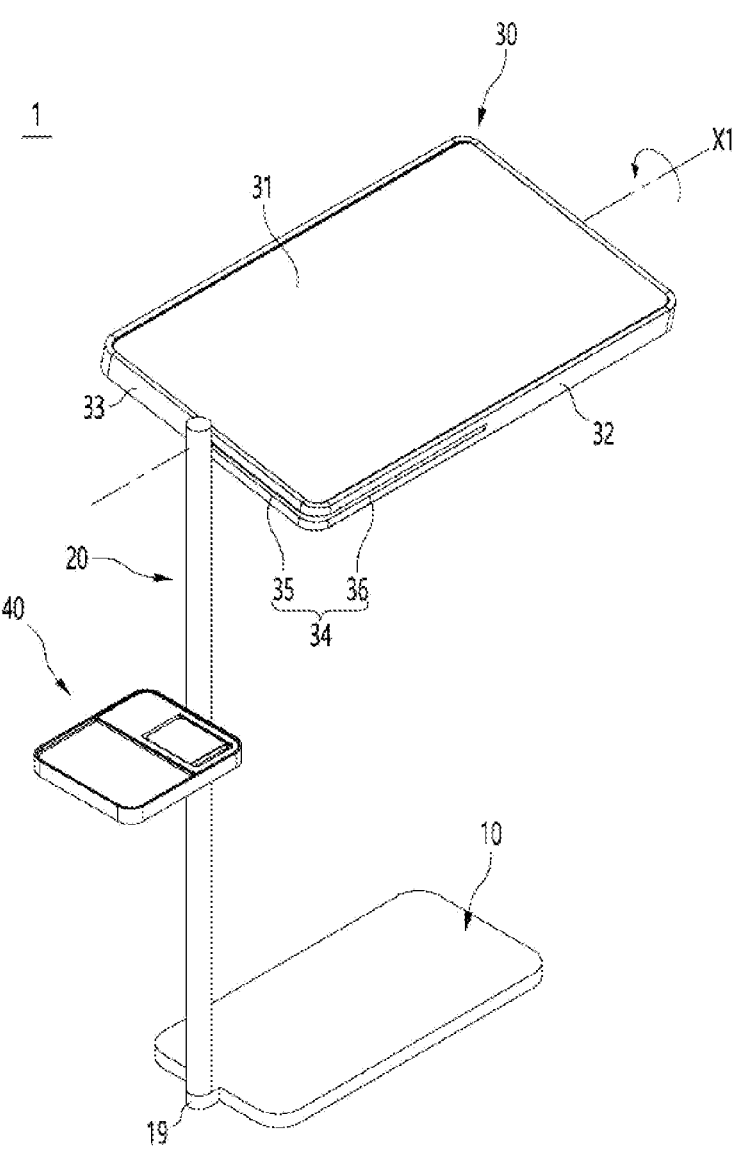

【FIG. 4】
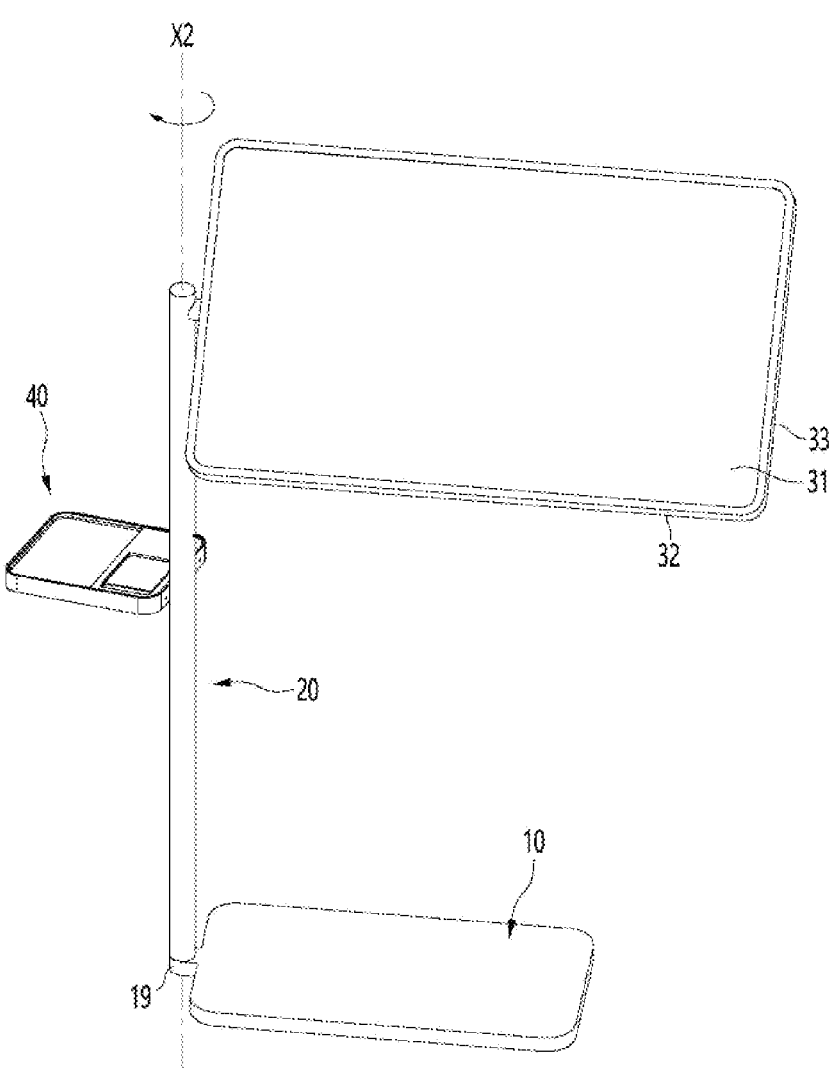

【FIG. 5】
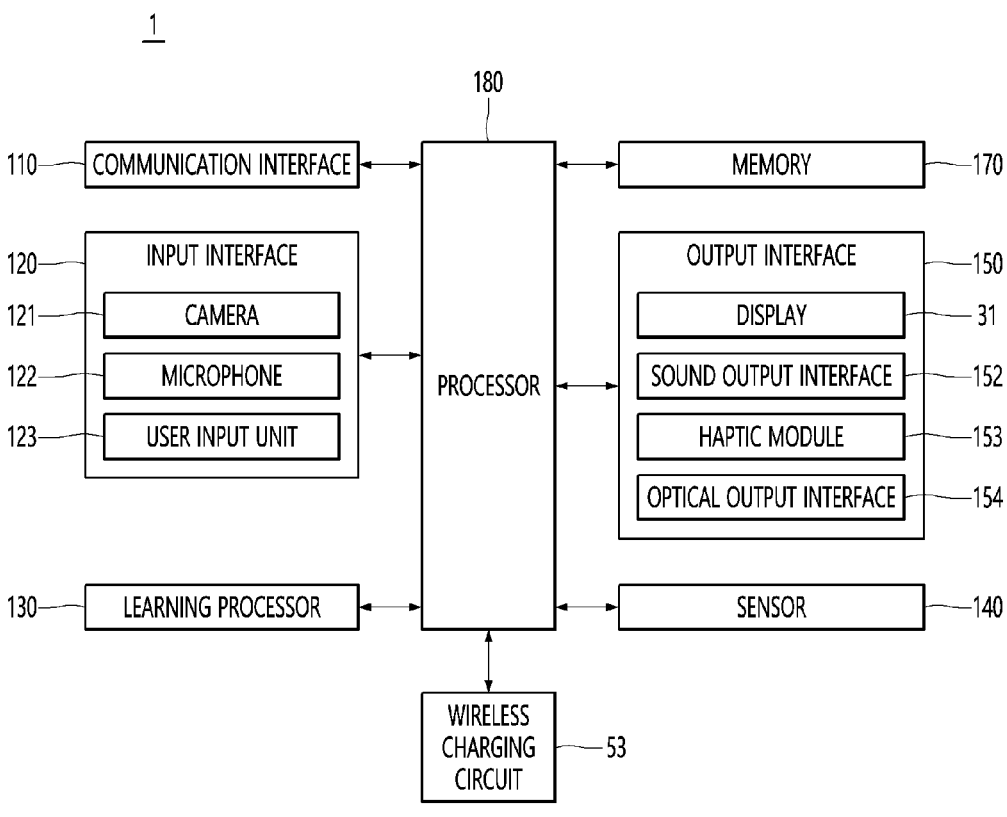

【FIG. 6】
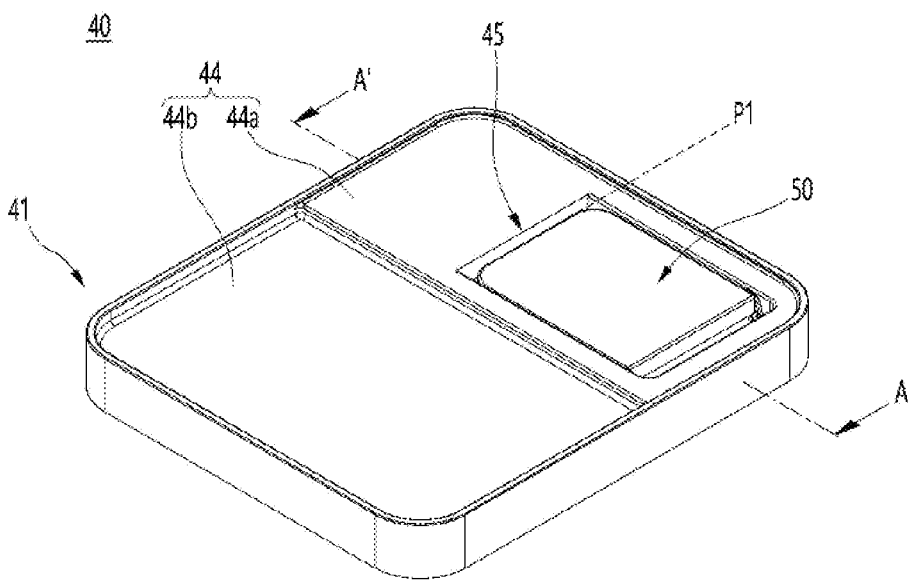

【FIG. 7】
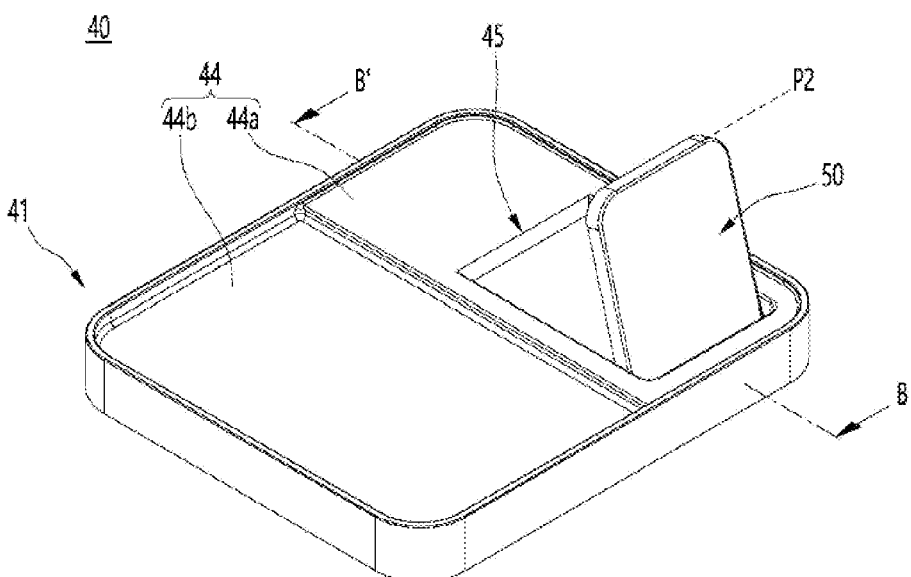

【FIG. 8】
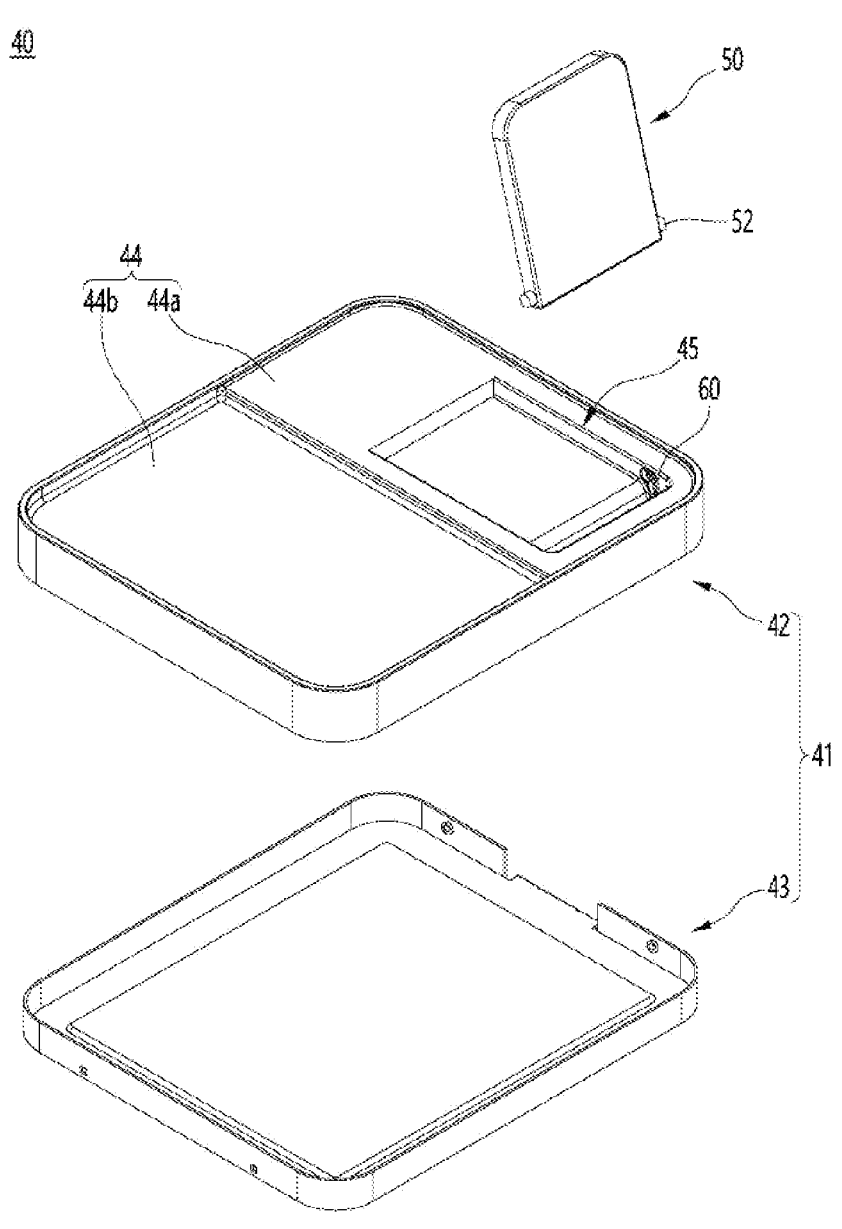

【FIG. 9】
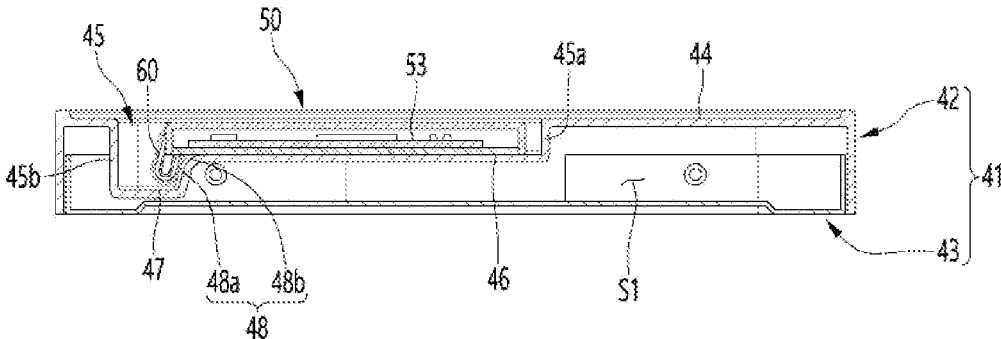
【FIG. 10】
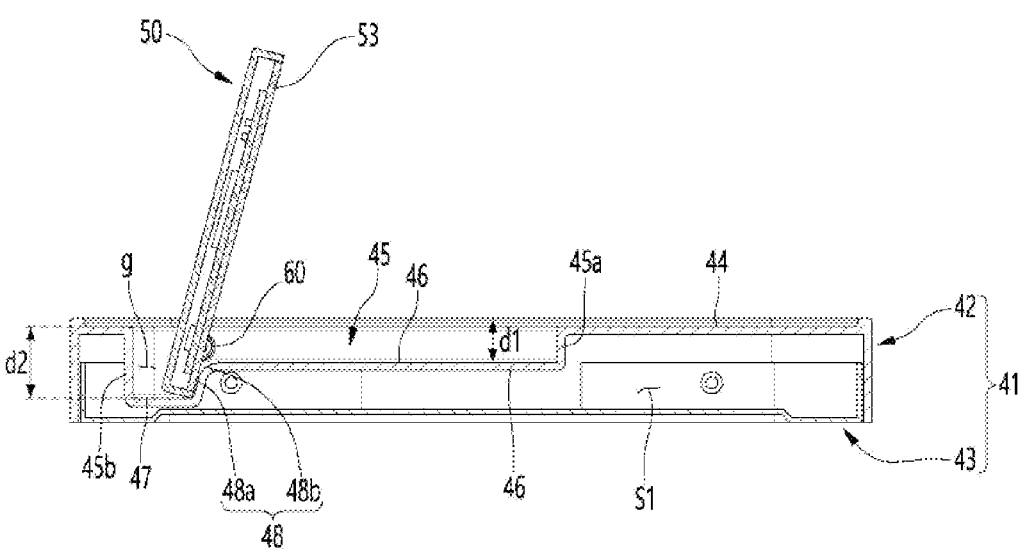

【FIG. 11】
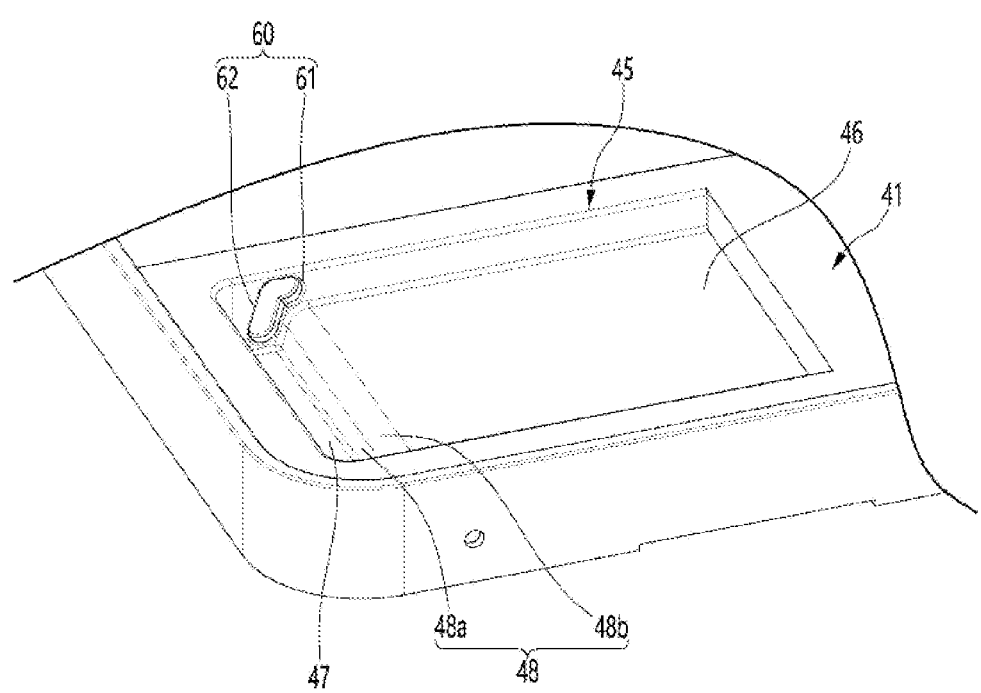

【FIG. 12】
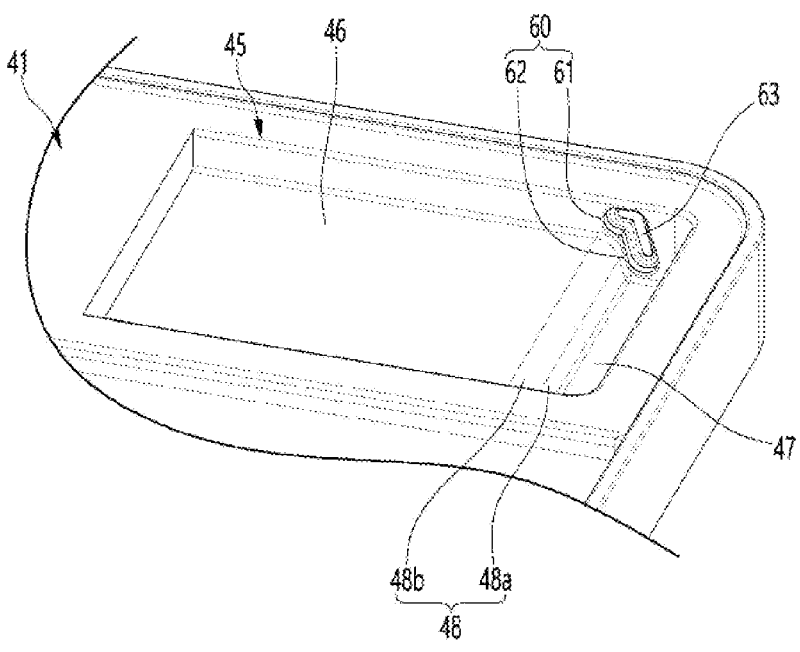

【FIG. 13】
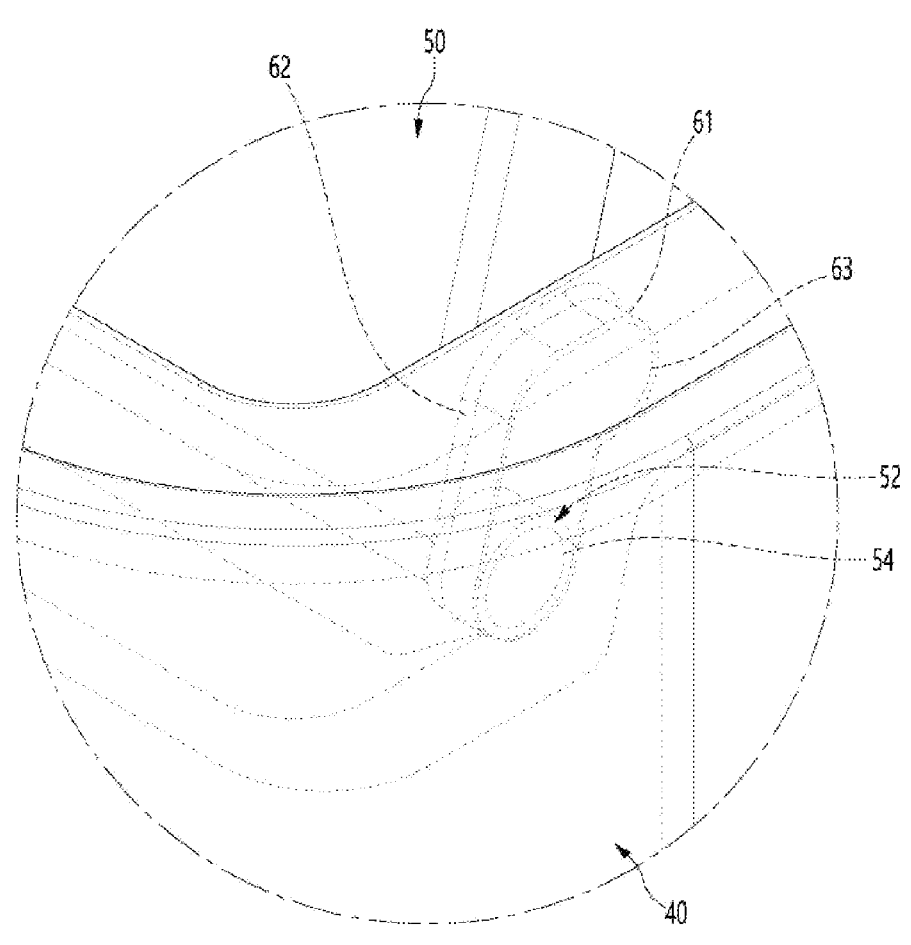

【FIG. 14】
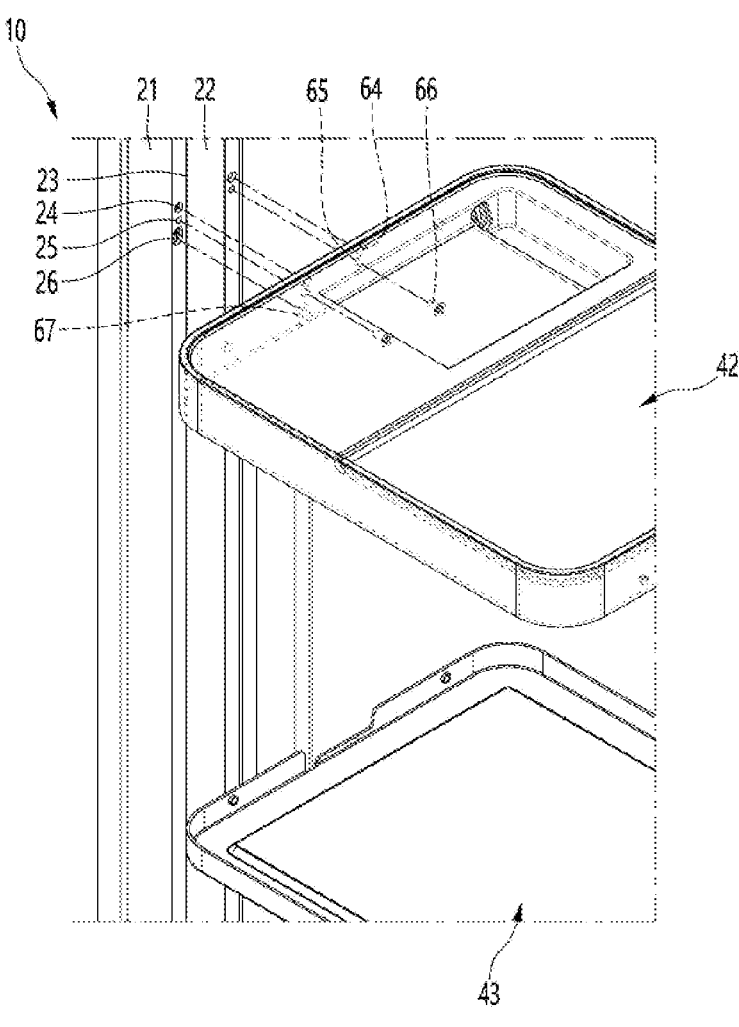

【FIG. 15】
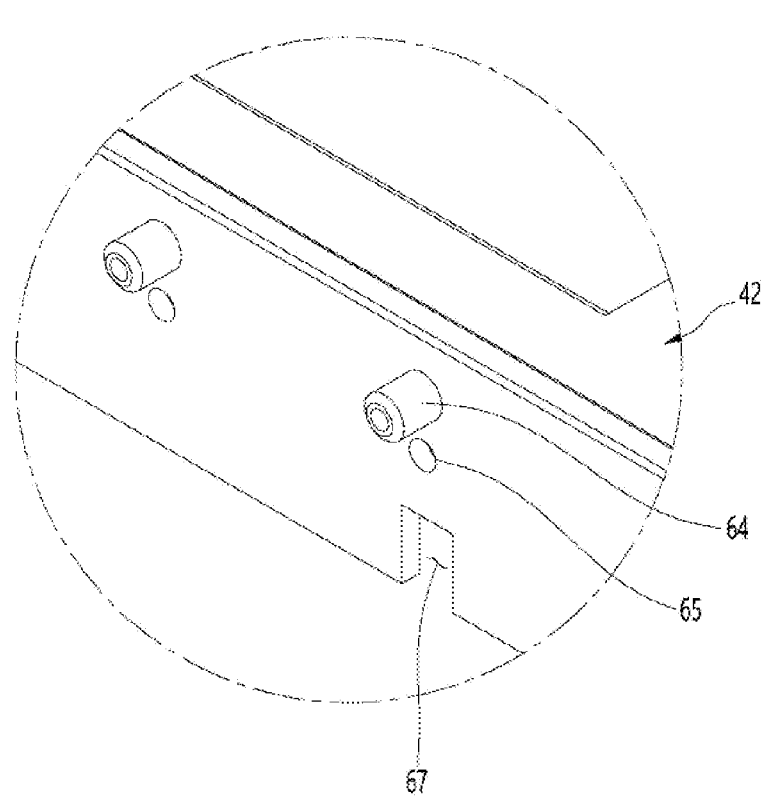

【FIG. 16】
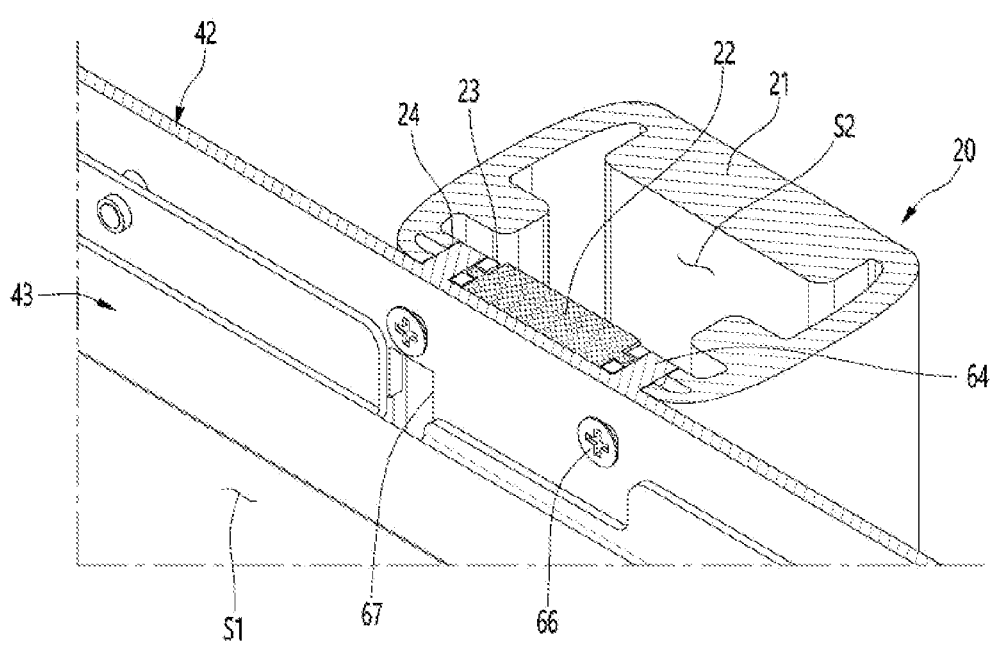

WIRELESS CHARGING CRADLE FOR TERMINAL AND DISPLAY DEVICE COMPRISING SAME

CROSS-REFERENCE TO RELATED APPLICATIONS

This application is the National Stage filing under 35 U.S.C. 371 of International Application No. PCT/KR2020/009345, filed on Jul. 15, 2020, the contents of which are all incorporated by reference herein in their entirety.

TECHNICAL FIELD

The present disclosure relates to a terminal wireless charging cradle and a display device including the same.

BACKGROUND ART

A terminal wireless charging cradle is a cradle capable of wirelessly charging a portable terminal such as a smartphone in a state of mounting the portable terminal.

However, a general terminal wireless charging cradle has a limit in which wireless charging is possible only in a state in which a portable terminal is laid down. In addition, in the case of a terminal wireless charging cradle for a vehicle, there is a limit in which wireless charging is possible only in a state in which a portable terminal is erect.

A display device is a device that displays image information received from the outside or image information stored therein. A typical example of the display device may include a television, a monitor, a laptop, a tablet, and the like.

Also, the display device may mirror a display screen of a portable terminal. Mirroring refers to outputting an image or a video output on one display identically to another display in real time.

However, a relatively small display device such as a tablet has a size limitation for portability. Conversely, a relatively large display device, such as a TV, requires a large installation space and has a difficulty in movement.

In addition, there is no configuration for mounting and wirelessly charging a portable terminal in a conventional display device.

INVENTION

Technical Problem

An object of the present disclosure is to provide a terminal wireless charging cradle capable of performing wireless charging in a state in which a portable terminal is laid down or erect, and a display device including the same.

Another object of the present disclosure is to provide a terminal wireless charging cradle capable of being easily connected to a stand and a display device including the same.

Technical Solution

A terminal wireless charging cradle according to an embodiment of the present disclosure may comprise a body disposed horizontally, a recess formed to be stepped downward from an upper surface of the body, a supporter having a wireless charging circuit built therein and movable between a first position laid down in the recess and a second position erected to protrude upward from the recess, a pair of guide grooves formed in both inner surfaces of the recess;

and a plurality of protrusions protruding from both lower sides of the supporter into the pair of guide grooves and sliding along the pair of guide grooves when the supporter moves.

Each of the guide grooves may comprise a first groove extending horizontally and a second groove extending in an inclined direction toward the front from a front end of the first groove toward a lower side.

The protrusion may be located at a rear end of the first groove when the supporter is at the first position, and the protrusion may be located at a lower end of the second groove when the supporter is at the second position.

The recess may comprise a first surface recessed with a first depth with respect to an upper surface of the body, the supporter at the first position being seated thereon, and a second surface recessed with a second depth deeper than the first depth with respect to the upper surface of the body, located in front of the first surface, and supporting a lower end of the supporter at the second position.

The recess may further comprise a third surface connecting the first surface and the second surface and located at a lower rear side of the supporter at the second position.

The third surface may comprises a flat portion formed in parallel with a rear surface of the supporter at the second position and connected to the second surface and a curved portion connecting the flat portion and the first surface in a round manner.

The guide groove may comprise a first groove extending horizontally, and a second groove extending to be inclined downward in a direction parallel to the flat portion from a front end of the first groove.

A front surface of the supporter at the second position may be spaced apart rearward from an inner front surface of the recess.

A first hole, through which a cable connected to the wireless charging circuit passes, may be formed in at least one of the pair of protrusions, and a second hole communicating with an internal space of the body and having a shape corresponding to the guide groove and having the cable passing therethrough may be formed in at least one of the pair of guide grooves.

A front surface of the supporter may be inclined in an inclined direction toward the rear toward an upper side when the supporter is at the second position.

A display device according to an embodiment of the present disclosure may comprise a base, a stand vertically extending upward from the base, a head provided with a display and connected to the stand, and a cradle located at a lower height than the head and connected to the stand, and the cradle may comprise a body disposed horizontally, a recess formed to be stepped downward from an upper surface of the body, a supporter having a wireless charging circuit built therein and movable between a first position laid down in the recess and a second position erected to protrude upward from the recess, a pair of guide grooves formed in both inner surfaces of the recess, and a plurality of protrusions protruding from both lower sides of the supporter into the pair of guide grooves and sliding along the pair of guide grooves when the supporter moves.

The display device may further comprise a processor configured to mirror a screen displayed on a display of a terminal supported on the supporter to a display of the head.

An upper surface of the body may comprise a first region in which the recess is formed, and a second region formed to be stepped lower than the first region and located opposite to the stand with the first region interposed therebetween.

A first hole may be formed in at least one of the pair of protrusions, a second hole communicating an internal space of the body and having a shape corresponding to the guide groove may be formed in at least one of the pair of guide grooves, a third hole communicating with the inside of the body may be formed in a circumferential surface of the body, a fourth hole facing the third hole and communicating with the inside of the stand may be formed in the stand, and a cable connected to the wireless charging circuit may sequentially passed through the first hole, the second hole, the third hole and the fourth hole and extend into the stand.

A display device according to an embodiment of the present disclosure may comprise a base, a stand vertically extending upward from the base, a head provided with a display and connected to the stand, and a cradle located at a lower height than the head and connected to the stand. The cradle may comprise a case having an open bottom, a lower cover covering the open bottom of the case, a protrusion pin protruding the case and inserted into an insertion hole formed in the stand, a through hole formed in the case to face the stand, and a screw passing through the through hole from the inside of the case and fastened to a fastening hole formed in the stand.

The case may comprise a non-metal material, and the lower cover may comprise a metal material.

The stand may comprise a frame having the insertion hole and the fastening hole formed therein and having an internal space, an opening formed in the frame and extending vertically, and a cover covering the opening.

A stand-side cable hole, through which the cable passing through the inside of the stand passes, may be formed in the stand, and a cradle-side cable hole facing the stand-side cable hole and having the cable passing therethrough may be formed between the case and the lower cover.

A periphery of the head may be connected to one side of the stand, and the cradle may be connected to the other side of the stand.

Effect of the Invention

According to a preferred embodiment of the present disclosure, when a supporter is at a first position, a portable terminal can be wirelessly charged in a lying state, and, when the supporter is at a second position, the portable terminal can be wirelessly charged in an erect state. Accordingly, the user's selectivity and convenience may be improved.

Also, a protrusion of the supporter may slide along a guide groove of a body. Accordingly, movement between the first position and the second position of the supporter can be smoothly guided.

In addition, since the supporter at the first position is laid down in a recess, a user may use a cradle as a shelf.

In addition, the supporter at the first position may be seated on a first surface of the recess, and a second surface may support a lower end of the supporter at the second position.

In addition, a third surface connecting the first surface and the second surface of the recess includes a rounded curved surface, so that the supporter can smoothly move between the first position and the second position.

In addition, the front surface of the supporter at the second position may be spaced apart rearward with respect to the inner front surface of the recess. Accordingly, the portable terminal can be inserted and mounted between the front surface of the supporter and the inner front surface of the recess.

Also, the cable may be connected to a wireless charging circuit built in the supporter through a first hole formed in the protrusion of the supporter and a second hole formed in the guide groove. This allows the wireless charging circuit to be powered or controlled via a cable.

Also, the second hole may have a shape corresponding to the guide groove. Accordingly, even if the projection slides along the guide groove, the connection of the cable can be maintained.

In addition, in a state in which the cradle is temporarily fixed to the stand by the protruding pins of the cradle, the connection between the cradle and the stand by a screw can be performed. This may facilitate the connection between the cradle and the stand.

In addition, since a lower cover of the cradle includes a metal material, it is possible to prevent the cradle from being deformed by the load of an object mounted on the cradle.

In addition, the cradle is connected to a frame of the stand, and the frame may include a metal material. Accordingly, the stand can stably withstand the load of the cradle and the object mounted on the cradle.

In addition, a cable hole through which a cable passes may be formed in the cradle and the stand. Accordingly, the cable connected to the wireless charging circuit may be extended to the inside of the stand through the cable hole, and may be connected to an electric component such as a battery built in a base.

DESCRIPTION OF DRAWINGS

FIG. 1 is a perspective view of a display device according to an embodiment of the present disclosure.

FIG. 2 is a perspective view of a state in which a head shown in FIG. 1 is pivoted in a portrait mode.

FIG. 3 is a diagram illustrating a state in which a head according to an embodiment of the present disclosure is tilted.

FIG. 4 is a diagram illustrating a state in which a head according to an embodiment of the present disclosure is swiveled.

FIG. 5 is a block diagram illustrating components of a display device according to an embodiment of the present disclosure.

FIG. 6 is a perspective view of a cradle according to an embodiment of the present disclosure.

FIG. 7 is a diagram illustrating a state in which a supporter illustrated in FIG. 6 is erect.

FIG. 8 is an exploded perspective view of a cradle according to an embodiment of the present disclosure.

FIG. 9 is a cross-sectional view taken along line A-A' of FIG. 6.

FIG. 10 is a cross-sectional view taken along line B-B' of FIG. 7.

FIGS. 11 and 12 are enlarged diagrams of a recess and its periphery according to an embodiment of the present disclosure.

FIG. 13 is a diagram illustrating a connection between a supporter and a cradle body according to an embodiment of the present disclosure.

FIGS. 14 to 16 are diagrams illustrating a connection between a cradle and a stand according to an embodiment of the present disclosure.

BEST MODE

Hereinafter, embodiments of the present disclosure will be described in detail with reference to drawings.

Hereinafter, when an element is described as being "fastened" or "connected" to another element, it means that two elements are directly fastened or connected, or a third element exists between the two elements and the two elements are connected or fastened by the third element. On the other hand, when it is described that one element is "directly fastened" or "directly connected" to another element, it may be understood that a third element does not exist between the two elements.

FIG. 1 is a perspective view of a display device according to an embodiment of the present disclosure. FIG. 2 is a perspective view of a state in which a head shown in FIG. 1 is pivoted in a portrait mode. FIG. 3 is a diagram illustrating a state in which a head according to an embodiment of the present disclosure is tilted. FIG. 4 is a diagram illustrating a state in which a head according to an embodiment of the present disclosure is swiveled.

The display device 1 according to the embodiment of the present disclosure may include a base 10, a stand 20 and a head 30.

The base 10 may support the display device 1 on a bottom surface.

The stand 20 may extend vertically upward from the base 10. The stand 20 may connect the base 10 and the head 30. The stand 20 may have a vertical bar shape but is not limited thereto.

More specifically, a lower end of the stand 20 may be connected to a periphery of the base 10. A stand connecting portion 19 protruding outwardly may be formed on the periphery of the base 10, and the lower end of the stand 20 may be connected to the stand connecting portion 19.

The head 30 may be spaced apart upward from the base 10. A display unit 31 may be provided on a front side of the head 30. An image or a video may be displayed on the display unit 31. Also, the display unit 31 may include a touchscreen.

The peripheries 32 and 33 of the head 30 may include a pair of long sides 32 and a pair of short sides 33. The longitudinal direction of the long side 32 and the longitudinal direction of the short side 33 may be orthogonal to each other. The length L1 of the long side 32 may be longer than the length L2 of the short side 33.

The head 30 may be pivoted between a landscape mode in which the long side 32 is horizontal and the short side 33 is vertical (see FIG. 1), and a portrait mode in which the long side 32 is vertical and the short side 33 is horizontal (see FIG. 2).

The head 30 may be positioned on the same side as the base 10 relative to the stand 20. That is, the head 30 may overlap the base 10 in a vertical direction. Therefore, since the center of gravity of the display device 1 does not deviate from the upper side of the base 10, the display device 1 may be stably supported without overturning.

The left-and-right lengths of the base 10 may be shorter than the length L1 of the long side 32 of the head 30 and longer than the length L2 of the short side 33. Therefore, the head 30 in the landscape mode may protrude laterally than the base 10. The base 10 may protrude laterally than the head 30 in the portrait mode.

The stand 20 may extend long enough. The upper-and-lower length of the stand 20 may be longer than the length L1 of the long side 32 of the head 30. The vertical length of the stand 20 may be longer than a sum L1+L2 of the length L1 of the long side 32 and the length L2 of the short side of the head 30.

The stand 20 may be connected to the peripheries 32,33 of the head 30. In more detail, an upper part of the stand 20 may be connected to the peripheries 32 and 33 of the head 30.

Since the stand 20 is connected to the peripheries 32 and 33 rather than the rear surface of the head 30, not only the appearance of the display device 1 may be improved in design, but also the rear surface of the head 30 may be used for other purposes. For example, a mirror and a backlight may be provided on the rear surface of the head 30.

The upper part of the stand 20 may face the peripheries 32 and 33 of the head 30 in a horizontal direction. In more detail, in the landscape mode, the upper part of the stand 20 may face the short side 33 of the head 30 in the horizontal direction. In the portrait mode, the upper part of the stand 20 may face the long side 32 of the head 30 in the horizontal direction.

A through groove 34 may be formed in the peripheries 32 and 33 of the head 30. The through groove 34 may extend along the peripheries 32 and 33 of the head 30. The head 30 may be connected to the stand 20 through the through hole 34.

In more detail, a connecting bar protruding toward the through hole 34 may be connected to the stand 20. The connecting bar may extend into the head 30 through the through hole 34.

The through hole 34 may include a first groove 35 formed in the short side 33 and a second groove 36 formed in the long side 32. The first groove 35 may extend along the short side 33, and the second groove 36 may extend along the long side 32. The first groove 35 and the second groove 36 may be connected. The first groove 35 and the second groove 36 may be connected to each other at the corners of the peripheries 32 and 33.

The first groove 35 may be formed in any one of the pair of short sides 33. The length of the first groove 35 may be shorter than that of the short side 33, and may be at least half that of the short side 33.

The second groove 36 may be formed in any one of the pair of long sides 32. The length of the second groove 36 may be shorter than that of the long side 32, and may be at least half that of the long side 32.

Accordingly, when the head 20 is pivoted, a state in which the connecting bar formed on the stand 20 passes through the through hole 34 may be maintained. In the landscape mode, the connecting bar may extend into the head 30 through the first groove 35. In the portrait mode, the connecting bar may extend into the head 30 through the second groove 36.

The stand 20 may be provided with a terminal wireless charging cradle 40 (hereinafter referred to as 'cradle').

The cradle 40 may be placed horizontally. A portable terminal (hereinafter referred to as 'terminal') such as a smartphone may be mounted on the cradle 40. The display device 1 may be configured to charge the terminal mounted on the cradle 40. In addition, the display device 1 may be configured to selectively mirror the screen of the terminal mounted on the cradle 40 to the display unit 31 of the head 30.

The cradle 40 may be positioned at a lower height than the head 30. In more detail, the vertical distance from the base 10 to the cradle 40 may be closer than the vertical distance from the base 10 to the head 30.

Also, the head 30 and the cradle 40 may be located on opposite sides with respect to the stand 20. In more detail, the head 30 may be located on one side of the stand 20, and the cradle 40 may be located on the other side of the stand 20.

On the other hand, as shown in FIG. 3, the head 30 may rotate about a horizontal axis x1 with respect to the stand 20. The horizontal axis x1 may correspond to the connecting bar. The connecting bar may be rotatably connected to the stand 20, and the head 30 may rotate together with the connecting bar. That is, the head 30 is capable of a tilt operation that is inclined at a predetermined angle with respect to the horizontal axis x1.

The tilt of the head 30 may be performed independently of the pivot of the head 30. In other words, the head 30 may be tilted in the landscape mode as well as in the portrait mode.

Also, the head 30 may be rotated (tilted) up to 180 degrees. That is, the head 30 may rotate so that the display unit 31 faces rearward and the rear surface of the head 30 faces forward.

Therefore, when a mirror and a backlight are provided on the rear surface of the head 30, a user may use the display device as a standing mirror or as a lamp.

Also, as shown in FIG. 4, the head 30 may rotate about a vertical axis x2 with respect to the base 10 together with the stand 20. In more detail, a lower end of the stand 20 may be rotatably connected to the stand connecting part 19 of the base 10. Accordingly, the head 30 is capable of a swivel operation in which a direction is changed at a predetermined angle with respect to the vertical axis x2.

The swivel operation of the head 30 may be performed independently of the pivot and tilt of the head 30. That is, the head 30 may swivel even in the landscape mode, swivel in the portrait mode, and swivel even when tilted at a predetermined angle.

FIG. 5 is a block diagram illustrating components of a display device according to an embodiment of the present disclosure.

The components of FIG. 5 may be provided in at least one of the base 10, the head 30, or the cradle 40 of FIG. 1, and may be added, deleted, or changed as needed.

Referring to FIG. 5, the display device 1 may include a communication interface 110, an input interface 120, a learning processor 130, a sensor 140, an output interface 150, a memory 170, and a processor 180.

The communication interface 110 may transmit/receive data to and from external devices such as another terminal or an external server using wired/wireless communication technology. For example, the communication interface 110 may transmit and receive sensor information, user input, a learning model, a control signal, and the like, to and from the external devices.

At this time, the communication technology used by the communication interface 110 includes GSM (Global System for Mobile communication), CDMA (Code Division Multi Access), LTE (Long Term Evolution), 5G, WLAN (Wireless LAN), Wi-Fi (Wireless-Fidelity), Bluetooth (Bluetooth™), RFID (Radio Frequency Identification), Infrared Data Association (IrDA), ZigBee, NFC (Near Field Communication), and the like.

The input interface 120 may acquire various types of data.

In this case, the input interface 120 may include a camera for inputting an image signal, a microphone for receiving an audio signal, a user input interface for receiving information from a user, and the like. Here, by treating the camera or microphone as a sensor, a signal obtained from the camera or microphone may be referred to as sensing data or sensor information.

The input interface 120 may acquire learning data for model training, input data to be used when acquiring an output using the learning model, and the like. The input interface 120 may acquire raw input data, and, in this case, the processor 180 or the learning processor 130 may extract an input feature as preprocessing of the input data.

The input interface 120 may include a camera 121 for inputting an image signal, a microphone 122 for receiving an audio signal, and a user input unit 123 for receiving information from a user.

Voice data or image data collected by the input interface 120 may be analyzed and processed as a user's control command.

The input interface 120 is for input of image information (or signal), audio information (or signal), data, or information input from a user. For input of image information, the display device 1 may include one or more cameras 121.

The camera 121 processes an image frame such as a still image or a moving image obtained by an image sensor in a video call mode or a shooting mode. The processed image frame may be displayed on the display unit 31 or stored in the memory 170.

The microphone 122 processes an external sound signal into electrical voice data. The processed voice data may be used in various ways according to a function being performed (or an application program being executed) by the display device 1. Meanwhile, various noise removal algorithms for removing noise generated in a process of receiving an external sound signal may be applied to the microphone 122.

The user input interface 123 is for receiving information from a user. When information is input through the user input interface 123, the processor 180 may control the operation of the display device 1 to correspond to the input information.

The user input interface 123 may include a mechanical input unit (or a mechanical key, for example, a button located on the front/rear surface or side surface of the terminal 1, a dome switch, a jog wheel, a jog switch, etc.) and a touch input unit. As an example, the touch input unit consists of a virtual key, a soft key, or a visual key displayed on the touchscreen through software processing, or a touch key disposed on a part other than the touchscreen.

The learning processor 130 may train a model composed of an artificial neural network by using learning data. Here, the trained artificial neural network may be referred to as a learning model. The learning model may be used to infer a result value with respect to new input data other than the learning data, and the inferred value may be used as a basis for a determination to perform a certain operation.

In this case, the learning processor 130 may include a memory integrated or implemented in the display device 1. Alternatively, the learning processor 130 may be implemented using the memory 170, an external memory directly coupled to the display device 1, or a memory maintained in an external device.

The sensor 140 may acquire at least one of internal information of the display device 1, surrounding environment information of the display device 1, or user information by using various sensors.

In addition, the sensor 140 is provided in the cradle 40 and, when the terminal approaches the cradle 40 or is mounted on the cradle 40, the sensor may detect it and generate a signal.

At this time, sensors included in the sensor 140 include a proximity sensor, an illuminance sensor, an acceleration sensor, a magnetic sensor, a gyro sensor, an inertial sensor, an RGB sensor, an IR sensor, a fingerprint recognition sensor, an ultrasonic sensor, an optical sensor, a microphone, a lidar, radar, etc.

The output interface 150 may generate an output related to visual, auditory or tactile sense.

In this case, the output interface 150 may include a display that outputs visual information, a speaker that outputs auditory information, and a haptic module that outputs tactile information.

The output interface 150 may include at least one of a display unit 31, a sound output interface 152, a haptic module 153, or an optical output interface 154.

The display unit 31 displays (outputs) information processed by the display device 1. For example, the display unit 31 may display execution screen information of an application program driven by the display device 1 or UI (User Interface) and GUI (Graphic User Interface) information according to the execution screen information.

The display unit 31 may have an inter-layered structure or an integrated structure with a touch sensor in order to facilitate a touch screen. The touchscreen may provide an output interface between the terminal 1 and a user, as well as function as the user input interface 123 which provides an input interface between the display device 1 and the user.

The sound output interface 152 may output audio data received from the communication interface 110 or stored in the memory 170 in a call signal reception, a call mode or a recording mode, a voice recognition mode, a broadcast reception mode, and the like.

The sound output interface 152 may include at least one of a receiver, a speaker, or a buzzer.

The haptic module 153 generates various tactile effects that a user feels. A typical example of a tactile effect generated by the haptic module 153 may be vibration.

The light output interface 154 outputs a signal for indicating the occurrence of an event by using the light of the light source of the display device 1. Examples of events generated by the display device 1 may include message reception, call signal reception, missed call, alarm, schedule notification, email reception, and information reception through an application.

The memory 170 may store data supporting various functions of the display device 1. For example, the memory 170 may store input data obtained from the input interface 120, learning data, a learning model, a learning history, and the like.

The processor 180 may determine at least one executable operation of the display device 1 based on information determined or generated using a data analysis algorithm or a machine learning algorithm. In addition, the processor 180 may control the components of the display device 1 to perform the determined operation.

To this end, the processor 180 may request, search, receive, or utilize the data of the learning processor 130 or the memory 170, and control the components of the display device 1 to perform a predicted operation or an operation determined to be preferable among the at least one executable operation.

In this case, when the connection of an external device is required to perform the determined operation, the processor 180 may generate a control signal for controlling the external device and transmit the generated control signal to the external device.

The processor 180 may obtain intention information with respect to user input, and determine a user's request based on the obtained intention information.

In this case, the processor 180 may obtain intention information corresponding to user input using at least one of a speech to text (STT) engine for converting voice input into a character string or a natural language processing (NLP) engine for obtaining intention information of a natural language.

In this case, at least one of the STT engine or the NLP engine may be configured as an artificial neural network, at least a part of which is trained according to a machine learning algorithm. In addition, at least one or more of the STT engine or the NLP engine may be trained by the learning processor 130, trained by an external server, or trained by distributed processing thereof.

The processor 180 may collect history information including user feedback on the operation content or operation of the display device 1 and store it in the memory 170 or the learning processor 130, or transmit it to an external device such as an external server. The collected history information may be used to update the learning model.

The processor 180 may control at least some of the components of the display device 1 in order to drive an application program stored in the memory 170. Furthermore, the processor 180 may operate by combining two or more of the components included in the display device 1 to drive the application program.

The display device 1 may further include a wireless charging circuit 53.

The wireless charging circuit 53 may be provided in the cradle 40. The wireless charging circuit 53 may perform wireless charging for the terminal mounted on the cradle 40.

The wireless charging circuit 53 may receive power from a power supply such as a battery (not shown) built in the base 10.

A known non-contact charging technology may be applied to the wireless charging circuit 53. For example, the wireless charging circuit 53 may charge the battery of the terminal by an electromagnetic induction method using induced current. As another example, the wireless charging circuit 53 may charge the battery of the terminal by a magnetic resonance method of transmitting power with a frequency. Since these known non-contact charging methods are implemented by a known technology, a detailed description thereof will be omitted.

The processor 180 may communicate with the sensor 140 provided in the cradle 40 to determine whether the terminal is mounted on the cradle 40. When the terminal approaches the cradle 40 or is mounted on the cradle 40, the processor 180 may control the wireless charging circuit 53 so that the terminal is wirelessly charged.

In addition, when the terminal approaches the cradle 40 or is mounted on the cradle 40, the processor 180 may mirror the screen displayed on the display of the terminal to the display unit 31 of the head 30.

FIG. 6 is a perspective view of a cradle according to an embodiment of the present disclosure. FIG. 7 is a diagram illustrating a state in which a supporter illustrated in FIG. 6 is erect. FIG. 8 is an exploded perspective view of a cradle according to an embodiment of the present disclosure.

The cradle 40 according to the present embodiment may include a body 41 and a supporter 50.

The body 41 may be fastened to the stand 20 (see FIG. 1). The body 41 may have a plate shape disposed horizontally. The body 41 may have an internal space S1 (see FIGS. 9 and 10).

In more detail, the body 41 may include a case 42 having an open bottom and a lower cover 43 covering the open bottom of the case 42. The inner space S1 of the body 41 may be formed between the case 42 and the lower cover 43.

The lower cover 43 may have higher strength than the case 42. In more detail, the case 42 may include a non-metal material, and the lower cover 43 may include a metal material. The lower cover 43 may include a metal material. Accordingly, the cradle 40 may more stably support the weight of an object placed on the upper surface 44 of the body 41.

A recess 45 may be formed in the body 41. The recess 45 may be formed by being recessed downwardly from an upper surface 44 of the body 41.

The recess 45 may be formed to correspond to the shape and size of the supporter 50 to be described later. The recess 45 may be formed closer to the front edge of the front and rear edges of the body 41.

In more detail, the upper surface 44 of the body 41 may include a first region 44a in which the recess 45 is formed, and a second region 44b that is stepped with respect to the first region 44a. For example, the second region 44b may be formed to be stepped lower than the first region 44a.

The first region 44a may be adjacent to the stand 20 (refer to FIG. 1). The second region 44b may be positioned on the opposite side of the stand 20 with the first region 44a interposed therebetween.

Accordingly, the user may intuitively distinguish between the first region 44a and the second region 44b. The user may mount the terminal on the supporter 50 located in the first region 44a, and may place a cup or laptop in the second region 44b.

The supporter 50 may support the terminal. The supporter 50 may be formed in a substantially plate shape.

The supporter 50 may have a built-in wireless charging circuit 53 (see FIGS. 9 and 10). The wireless charging circuit 53 may perform wireless charging for the terminal supported by the supporter 50.

The supporter 50 may be connected to the body 41, more specifically, the recess 45.

In more detail, a pair of protrusions 52 may be formed on both lower sides of the supporter 50, and a pair of guide grooves 60, into which the protrusions 52 are inserted, may be formed in both inner sides of the recess 45 of the body 41.

The pair of guide grooves 60 may be formed in both inner sides of the front portion of the recess 45. The pair of protrusions 52 may protrude into the guide groove 60 from both lower sides of the supporter 50.

Each protrusion 52 may be rotatably inserted into the guide groove 60, and may slide along the guide groove 60.

In more detail, the supporter 50 is movable between a first position P1 (see FIG. 6) laid down in the recess 45 and a second position P2 erected to protrude upward from the recess 45. When the supporter 50 moves, the pair of protrusions 52 may slide along the pair of guide grooves 60. That is, the guide groove 60 may guide the movement trajectory of the supporter 50.

The supporter 50 at the first position P1 may be accommodated in the recess 45. In this case, the upper surface of the supporter 50 may be located on the upper surface 44 of the body 41, more specifically, the same horizontal plane as the first region 44a. Accordingly, when the supporter 50 is at the first position P1, the user may utilize not only the second region 44b but also the first region 44a as a shelf on which a laptop or cup is placed.

In addition, the user may lay the terminal on the upper side of the supporter 50 at the first position P1, and the wireless charging circuit 53 in the supporter 50 may perform wireless charging with respect to the terminal.

The user may mount the terminal on the supporter 50, after moving the supporter 50 to the second position P1. In this case, the rear surface of the terminal may be supported by the supporter 50, and the lower end of the terminal may be inserted into the recess 45. Accordingly, the terminal may be mounted in an erect state and the wireless charging circuit 53 in the supporter 50 may perform wireless charging with respect to the terminal.

The supporter 50 at the second position P2 may protrude upward from the recess 45. That is, a lower portion of the supporter may be located in the recess. Also, the front surface of the supporter 50 at the second position P2 may be inclined in an inclined direction toward the rear toward the upper side. For example, the front surface of the supporter 50 at the second position P2 may be inclined at an angle of approximately 75 degrees. Accordingly, the front surface of the supporter 50 may stably support the terminal.

FIG. 9 is a cross-sectional view taken along line A-A' of FIG. 6. FIG. 10 is a cross-sectional view taken along line B-B' of FIG. 7. FIGS. 11 and 12 are enlarged diagrams of a recess and its periphery according to an embodiment of the present disclosure. FIG. 13 is a diagram illustrating a connection between a supporter and a cradle body according to an embodiment of the present disclosure.

The recess 45 may include a first surface 46 on which the supporter 50 at a first position P1 is seated and a second surface 47 supporting the lower end of the supporter 50 at the second position P2. The recess 45 may further include a third surface 48 connecting the first surface 46 and the second surface 47.

The first surface 46 may be a seating surface on which the supporter 50 at the first position P1 is seated. The first surface 46 may be recessed with a first depth d1 with respect to the upper surface 44 of the body 41.

The second surface 47 may be a support surface supporting the lower end of the supporter 50 at the second position P2. The second surface 47 may be recessed with a second depth d2 deeper than the first depth d1 with respect to the upper surface 44 of the body 41. The second surface 47 may be positioned to be stepped lower than the first surface 46. The area of the second surface 47 may be smaller than that of the first surface 46.

The second surface 47 may be positioned in front of the first surface 46. In more detail, the second surface 47 may be connected to the inner front surface 45b of the recess 45, and the first surface 46 may be connected to the inner rear surface 45a of the recess 45.

The front surface of the supporter 50 at the second position P2 may be spaced apart rearward from the inner front surface 45b of the recess 45. In more detail, a gap g, into which the terminal may be inserted, may be formed between the lower front surface of the supporter 50 at the second position P2 and the inner front surface 45b of the recess 45. The gap g may be formed at the upper side of the second surface 47.

The third surface 48 may be a connection surface connecting the first surface 46 and the second surface 47. The third surface 48 may be located at the lower rear side of the supporter 50 at the second position P2. The third surface 48 may support the lower rear surface of the supporter 50 at the second position P2.

In more detail, the third surface 48 is formed in parallel with the rear surface of the supporter 50 at the second position P2 and may include a flat portion 48a connected to the second surface 47 and a curved portion 48b connecting the flat portion 48a and the first surface 46 in a round manner.

The flat portion 48a may support the lower rear surface of the supporter 50 at the second position P2.

The curved portion 48b may assist in smooth movement of the supporter 50. The rear surface of the supporter 50 is maintained in contact with the curved portion 48*b* and is movable between the first position P1 and the second position P2.

On the other hand, the guide groove 60 may include a first groove 61 extending horizontally, and a second groove 62 extending in an inclined direction toward the front from the front end of the first groove 61 to a lower side.

When the supporter 50 is moved, the protrusion 52 may slide between both ends of the guide groove 60. In more detail, the protrusion 52 may slide between the rear end of the first groove 61 and the lower end of the second groove 62.

The protrusion 52 of the supporter 50 at the first position P1 may be located at the rear end of the first groove 61. The protrusion 52 of the supporter 50 at the second position P2 may be located at the lower end of the second groove 62.

The rear end of the first groove 61 may be located above the first surface 46 or above the curved portion 48*b* of the third surface 48. The lower end of the second groove 62 may be located above the second surface 47. The second groove 62 may be formed to be inclined downward in a direction parallel to the flat portion 48*a* of the third surface 48.

On the other hand, the wireless charging circuit 53 built in the supporter 50 may receive power by a cable (not shown). The cable sequentially passes through a first hole 54 formed in the protrusion 52 of the supporter 50 and a second hole 63 formed in the guide groove 60 to extend to an inner space S1 of the body 41. In addition, the cable may extend into the base 10 through the inside S2 (see FIG. 16) of the stand 20 in the internal space S1 of the body 41 and may be connected to the battery or power supply built in the base 10.

In more detail, the first hole 54 through which the cable connected to the wireless charging circuit 53 passes may be formed in at least one of the pair of protrusions 52 formed on the supporter 50. For example, the first hole 54 may be formed in one protrusion 52 closer to the stand 20 among the pair of protrusions 52.

The first hole 54 communicates with the inside of the supporter 50 and may extend in the longitudinal direction of the protrusion 52. That is, the protrusion 52 in which the first hole 54 is formed may have a hollow shape.

The second hole 63 communicating with the inner space S1 of the body 41 may be formed in at least one of the pair of guide grooves 60. For example, the second hole 63 may be formed in one guide groove 60 closer to the stand 20 among the pair of guide grooves 60.

The second hole 63 may communicate with the first hole 54, and may have a shape corresponding to the guide groove 60. Therefore, even if the protrusion 52 slides along the guide groove 60, a state in which the cable passes through the first hole 54 of the protrusion 52 and the second hole 63 of the guide groove 60 may be maintained. That is, regardless of whether the supporter 50 moves between the first position P1 and the second position P2, the connection of the cable for power supply to the wireless charging circuit 53 may be maintained.

FIGS. 14 to 16 are diagrams illustrating a connection between a cradle and a stand according to an embodiment of the present disclosure.

The stand 20 may include a frame 21 having an opening 23 formed therein, and a cover 22 covering the opening 23.

An inner space S2 may be formed in the frame 21. The inner space S2 of the frame 21 may extend in the longitudinal direction of the frame 21.

The inner space S2 of the frame 21 may be a passage through which a plurality of cables pass. The plurality of cables may be wires connecting a plurality of electrical components to each other. For example, any one cable may connect an electrical component (e.g., a battery) disposed inside the base 10 and an electrical component disposed inside the head 30 to each other. The other cable may connect an electrical component (e.g., a battery) disposed inside the base 10 and an electrical component (e.g., a wireless charging circuit) disposed in the cradle 40 to each other.

The opening 23 may be formed in one surface of the frame 21, and may communicate with the internal space S2 of the frame 21. The opening 23 may extend in the longitudinal direction of the frame 21. The one surface of the frame 21 may be a surface to which the cradle 40 is connected.

The cover 22 may cover the opening 23 and may extend in the longitudinal direction of the frame 21.

The connection operation of the cable through the internal space S2 of the stand 20 may be facilitated by the opening 23. In addition, since the cable is not visible from the outside by the cover 22, the appearance of the stand 20 may be neat.

Meanwhile, as described above, the body 41 of the cradle 40 may be connected to the stand 20.

In more detail, a protruding pin 64 may be formed in the case 42, and an insertion hole 24 into which the protruding pin 64 is inserted may be formed in the stand 20.

The protruding pin 64 may protrude horizontally from the circumferential surface of the case 42 toward the stand 20. A plurality of protrusion pins 64 may be provided to be spaced apart from each other. Accordingly, a plurality of insertion holes 24 spaced apart from each other may be formed in the stand 20.

In addition, a through hole 65 may be formed in the case 42, and a fastening hole 25 facing the through hole 65 may be formed in the stand 20. A screw 66 may pass through the through hole 65 from the inside of the case 42 to be fastened to the fastening hole 25.

The through hole 65 may be formed in the circumferential surface of the case 42. The through hole 65 may face the stand 20. The through hole 65 may be formed below the protruding pin 64. In addition, the fastening hole 25 may be formed below the insertion hole 24.

The through hole 65 may be formed in the circumferential surface of the case 42 and may face the stand 20. A plurality of through holes 65 may be provided to be spaced apart from each other. Accordingly, a plurality of fastening holes 25 spaced apart from each other may be formed in the stand 20.

An operator may preferentially insert the protruding pin 64 of the case 42 into the insertion hole 24 of the stand 20. That is, the protrusion pin 64 and the insertion hole 24 may be configured to temporarily fix the cradle 40 to the stand 20.

Thereafter, the operator may fasten the screw 66 to the fastening hole 25 of the stand 20 through the through hole 65 of the case 42, and fasten the lower cover 43 with the case 42. This completes the connection between the cradle 40 and the stand 20.

The insertion hole 24 and the fastening hole 25 may be formed in the frame 21. That is, the cradle 40 may be connected to the frame 21.

The frame 21 may have a metal material, and the cover 22 may have a non-metal material. That is, since the frame 21 has a higher strength than the cover 22, it is possible to stably support the cradle 40 and the load of the object mounted on the cradle 40.

In more detail, the plurality of insertion holes 24 may include a pair of insertion holes 24 spaced apart from each other with the opening 23 interposed therebetween. In addition, the plurality of fastening holes 25 may include a pair of fastening holes 25 spaced apart from each other with the opening 24 interposed therebetween.

On the other hand, the circumferential surface of the body 41 of the cradle 40 may be formed with a third hole 67 communicating with the internal space S1 of the body 41.

In more detail, the third hole 67 may be formed below the protruding pin 64 and the through hole 65. The third hole 67 may be formed between the case 42 and the lower cover 43. In more detail, the third hole 67 may be formed in the case 42 so that the lower end thereof may be opened, and the lower end of the third hole 67 may be covered by the lower cover 43. However, the present disclosure is not limited thereto.

In addition, the stand 20 may be formed with a fourth hole 26 that faces the third hole 67 and communicates with the internal space S2 of the stand 20.

In more detail, the fourth hole 26 may be formed in the frame 21. The fourth hole 26 may be located at one side of the opening 22. The fourth hole 26 may be formed below the insertion hole 24 and the fastening hole 25.

However, the present disclosure is not limited thereto, and the fourth hole 26 may be formed in the cover 22.

The third hole 67 may be called a cradle-side cable hole, and the fourth hole 26 may be called a stand-side cable hole.

The cable connected to the wireless charging circuit 53 (see FIGS. 9 and 10) of the supporter 50 sequentially passes through a first hole 54 (see FIG. 13) formed in the protrusion 52 of the supporter 50 (see FIG. 13), a second hole 63 formed in the guide groove 60, a third hole 67 formed in the body 41 and a fourth hole 26 formed in the stand 20, and extend to the internal space S2 of the stand 20. Accordingly, the wireless charging circuit 53 may receive power by the cable or may be controlled by the processor 180 (see FIG. 5).

The above description is merely illustrative of the technical spirit of the present disclosure, and various modifications and variations will be possible without departing from the essential characteristics of the present disclosure by those skilled in the art to which the present invention pertains.

Therefore, the embodiments disclosed in the present disclosure are not intended to limit the technical spirit of the present disclosure, but are intended to explain the technical spirit of the present disclosure, and the scope of the technical spirit of the present invention is not limited by these embodiments.

The scope of the present disclosure should be construed by the following claims, and all technical ideas within the equivalent range should be construed as being included in the scope of the present disclosure.

The invention claimed is:

1. A terminal wireless charging cradle comprising:
a body disposed horizontally;
a recess formed to be stepped downward from an upper surface of the body;
a supporter having a wireless charging circuit built therein and movable between a first position laid down in the recess and a second position erected to protrude upward from the recess;
a pair of guide grooves formed in both inner surfaces of the recess; and
a plurality of protrusions protruding from both lower sides of the supporter into the pair of guide grooves and sliding along the pair of guide grooves when the supporter moves.

2. The terminal wireless charging cradle of claim 1, wherein each of the pair of guide grooves comprises:

a first groove extending horizontally; and
a second groove extending in an inclined direction toward the front from a front end of the first groove toward a lower side.

3. The terminal wireless charging cradle of claim 2, wherein the protrusion is located at a rear end of the first groove when the supporter is at the first position, and wherein the protrusion is located at a lower end of the second groove when the supporter is at the second position.

4. The terminal wireless charging cradle of claim 1, wherein the recess comprises:
a first surface recessed with a first depth with respect to an upper surface of the body, the supporter at the first position being seated thereon; and
a second surface recessed with a second depth deeper than the first depth with respect to the upper surface of the body, located in front of the first surface, and supporting a lower end of the supporter at the second position.

5. The terminal wireless charging cradle of claim 4, wherein the recess further comprises a third surface connecting the first surface and the second surface and located at a lower rear side of the supporter at the second position.

6. The terminal wireless charging cradle of claim 5, wherein the third surface comprises:
a flat portion formed in parallel with a rear surface of the supporter at the second position and connected to the second surface; and
a curved portion connecting the flat portion and the first surface in a round manner.

7. The terminal wireless charging cradle of claim 6, wherein the guide groove comprises:
a first groove extending horizontally; and
a second groove extending to be inclined downward in a direction parallel to the flat portion from a front end of the first groove.

8. The terminal wireless charging cradle of claim 1, wherein a front surface of the supporter at the second position is spaced apart rearward from an inner front surface of the recess.

9. The terminal wireless charging cradle of claim 1, wherein a first hole, through which a cable connected to the wireless charging circuit passes, is formed in at least one of the pair of protrusions, and
wherein a second hole communicating with an internal space of the body and having a shape corresponding to the guide groove and having the cable passing therethrough is formed in at least one of the pair of guide grooves.

10. The terminal wireless charging cradle of claim 1, wherein a front surface of the supporter is inclined in an inclined direction toward the rear toward an upper side when the supporter is at the second position.

11. A display device comprising:
a base;
a stand vertically extending upward from the base;
a head provided with a display and connected to the stand; and
a cradle located at a lower height than the head and connected to the stand,
wherein the cradle comprises:
a body disposed horizontally;
a recess formed to be stepped downward from an upper surface of the body;

a supporter having a wireless charging circuit built therein and movable between a first position laid down in the recess and a second position erected to protrude upward from the recess;

a pair of guide grooves formed in both inner surfaces of the recess; and a plurality of protrusions protruding from both lower sides of the supporter into the pair of guide grooves and sliding along the pair of guide grooves when the supporter moves.

12. The display device of claim 11, further comprising a processor configured to mirror a screen displayed on a display of a terminal supported on the supporter to a display of the head.

13. The display device of claim 11, wherein an upper surface of the body comprises:

a first region in which the recess is formed; and a second region formed to be stepped lower than the first region and located opposite to the stand with the first region interposed therebetween.

14. The display device of claim 11, wherein a first hole is formed in at least one of the pair of protrusions, wherein a second hole communicating an internal space of the body and having a shape corresponding to the guide groove is formed in at least one of the pair of guide grooves, wherein a third hole communicating with the inside of the body is formed in a circumferential surface of the body, wherein a fourth hole facing the third hole and communicating with the inside of the stand is formed in the stand, and wherein a cable connected to the wireless charging circuit sequentially passes through the first hole, the second hole, the third hole and the fourth hole and extends into the stand.

15. The display device of claim 11, wherein a periphery of the head is connected to one side of the stand, and wherein the cradle is connected to the other side of the stand.

* * * * *